(12) United States Patent  (10) Patent No.: US 9,307,668 B2
Graf                       (45) Date of Patent:    Apr. 5, 2016

(54) HOUSING FOR AN ELECTRIC CIRCUIT FOR A FUEL PUMP

(75) Inventor: Rolf Graf, Glashütten (DE)

(73) Assignee: Continental Automotive GmbH, Hannover (DE)

( * ) Notice: Subject to any disclaimer, the term of this patent is extended or adjusted under 35 U.S.C. 154(b) by 89 days.

(21) Appl. No.: 13/809,847

(22) PCT Filed: Jul. 7, 2011

(86) PCT No.: PCT/EP2011/061543
§ 371 (c)(1),
(2), (4) Date: Jan. 11, 2013

(87) PCT Pub. No.: WO2012/007355
PCT Pub. Date: Jan. 19, 2012

(65) Prior Publication Data
US 2013/0114221 A1    May 9, 2013

(30) Foreign Application Priority Data
Jul. 12, 2010 (DE) .......................... 10 2010 026 954

(51) Int. Cl.
H05K 5/00 (2006.01)
H05K 7/14 (2006.01)
H05K 1/02 (2006.01)
F04D 13/06 (2006.01)
F02M 37/08 (2006.01)
H05K 3/34 (2006.01)

(52) U.S. Cl.
CPC .......... *H05K 7/1427* (2013.01); *F04D 13/0686* (2013.01); *H05K 1/02* (2013.01); *H05K 5/0056* (2013.01); *H05K 5/0082* (2013.01); *F02M 37/08* (2013.01); *H05K 3/341* (2013.01); *H05K 2201/0715* (2013.01); *H05K 2201/10371* (2013.01)

(58) Field of Classification Search
USPC .................................. 361/752, 818, 736, 748
See application file for complete search history.

(56) References Cited

U.S. PATENT DOCUMENTS

| 4,998,865 | A | 3/1991 | Nakanishi et al. | |
| 2004/0235317 | A1 | 11/2004 | Schiefer | |
| 2006/0057002 | A1 | 3/2006 | Nakanishi | |
| 2008/0115772 | A1 | 5/2008 | Kuperus | |
| 2008/0246227 | A1 | 10/2008 | Graf | |
| 2009/0090330 | A1* | 4/2009 | Tateishi et al. | 123/357 |
| 2009/0183715 | A1 | 7/2009 | Yamamoto et al. | |
| 2009/0231825 | A1* | 9/2009 | Li et al. | 361/818 |

FOREIGN PATENT DOCUMENTS

| CN | 101111673 | 1/2008 |
| DE | 42 37 870 A1 | 3/1994 |

(Continued)

*Primary Examiner* — Andargie M Aychillhum
(74) *Attorney, Agent, or Firm* — Cozen O'Connor

(57) ABSTRACT

A housing for an electronic circuit for a fuel pump includes a base and a cover which is connected to the base, a printed circuit board and, disposed on one side of the latter, electric and/or electronic components. Disposed on the side of the printed circuit board on which the components are disposed is a self-contained metal strip. The components are arranged in the region surrounded by the strip. A cover is soldered to the self-contained strip in such a way that the printed circuit board forms a base, the cover forms a housing, and the printed circuit board has at least one blocking layer.

16 Claims, 2 Drawing Sheets

(56) References Cited

FOREIGN PATENT DOCUMENTS

| DE | 195 16 548 | A1 | | 11/1996 |
| DE | 19516548 | A1 | * | 11/1996 |
| DE | 100 26 756 | C2 | | 12/2001 |
| DE | 101 62 600 | A1 | | 7/2003 |
| DE | 10 2007 017 529 | A1 | | 10/2008 |
| FR | 2 908 696 | A1 | | 5/2008 |

* cited by examiner

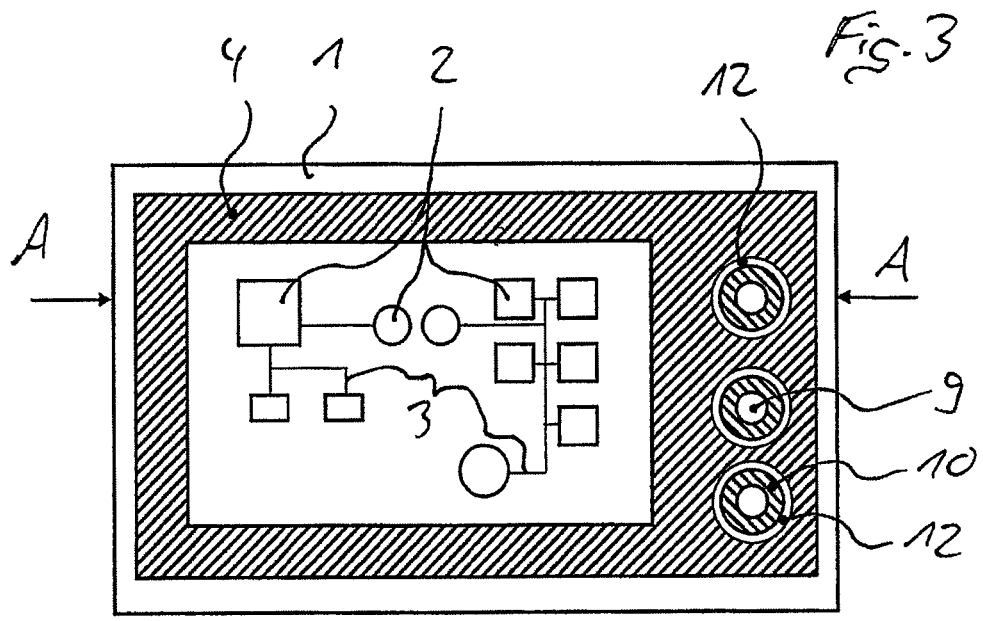
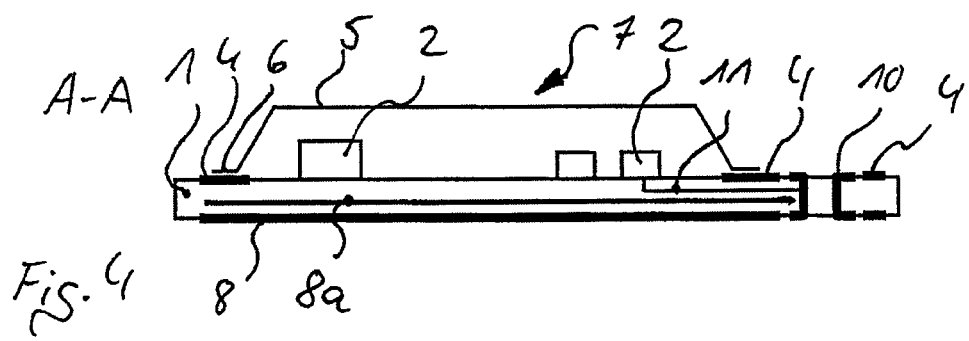
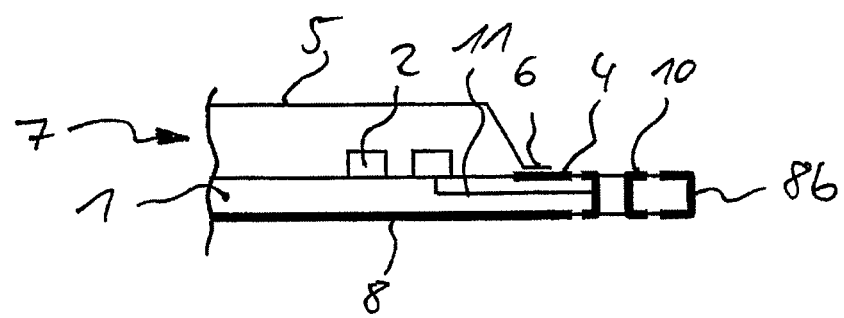

HOUSING FOR AN ELECTRIC CIRCUIT FOR A FUEL PUMP

PRIORITY CLAIM

This is a U.S. national stage of PCT International Application No. PCT/EP2011/061543, filed on 7 Jul. 2011, which claims priority to German Application No. 10 2010 026 954.9, filed 12 Jul. 2010, the contents of which are incorporated herein by reference in its entirety.

BACKGROUND OF THE INVENTION

1. Field of the Invention

The present invention relates to a housing for an electronic circuit for a fuel pump, composed of a printed circuit board, electric and/or electronic components arranged on the printed circuit board, a base and a cover which is connected to the base, wherein the base and the cover form the housing.

2. Description of the Related Art

An electronic circuit is used in fuel pumps of motor vehicles in order to feed fuel from a fuel container to an internal combustion engine. The electronic circuit is required to operate the electronically regulated electric motor of the fuel pump. The printed circuit boards which are used here are generally composed of fiber-reinforced plastic. The plastics used are epoxides or else duroplasts and thermoplasts or specific plastics such as PTFE. The fiber materials used are glass fibers, plastic fibers and carbon fibers as well as plant fibers and paper. Owing to the arrangement of the electronic circuit in the fuel pump or in the immediate surroundings thereof, the electronic components and conductor tracks have to be protected against the aggressive components of the fuel. Since fuel components also diffuse through printed circuit boards, they do not offer sufficient protection. For this reason, in order to protect the electronic circuit the printed circuit board is arranged with the components inside a sealed metal housing. The feedthroughs for the electric connections have to be embodied as glass/metal feedthroughs. The disadvantage of these glass/metal feedthroughs is the complexity and the cost involved in manufacturing the seal.

It is also known to arrange components on a ceramic base and to solder the ceramic base to and metal cover, with the result that the components are arranged protected between the ceramic base and the cover. The ceramic base acts here as a diffusion barrier for the fuel.

A disadvantage in known embodiments is the considerable cost factor of such housings, which cost factor permits economic use only for high-value applications.

SUMMARY OF THE INVENTION

An object of the present invention is to provide a housing of an electronic circuit whose components are protected sufficiently against fuel. The protection of the electronic circuit is intended to be achieved here in a cost-effective way.

According to the present invention, the object is achieved in that an enclosed metallic track is arranged on the side of the printed circuit board on which the components are arranged. The components are arranged in the region enclosed by the track. A cover is connected to the enclosed track by means of a soldered connection in such a way that the printed circuit board, as a base, and the cover form a housing. The printed circuit board has at least one blocking layer.

In this context, use is made of the fact that both the printed circuit board and electronic components have a certain degree of resistance to aggressive substances contained in fuels. With the housing according to the present invention it is therefore not necessary to achieve an absolute blocking effect, which in turn would be possible only with a hermetically sealed housing. Instead, the already existing resistance of the printed circuit board and of the component is combined with the blocking effect of the housing according to the present invention in order to ensure sufficient protection of the electronic circuit. This makes it possible to use the printed circuit board as a housing base and therefore as a component of a housing. A separate housing base is not necessary. As a result, the housing can be made simpler and more cost-effective.

In one simple embodiment, the blocking layer is arranged on the side of the printed circuit board facing away from the components. This side of the printed circuit board is generally free of components, with the result that a blocking layer can be arranged on this side of the printed circuit board with particularly little expenditure.

In another embodiment, the blocking layer is already provided when the printed circuit board is manufactured if the blocking layer is arranged as a layer in the printed circuit board. Arranging a plurality of blocking layers, preferably two to three blocking layers, in the printed circuit board contributes to increasing the blocking effect, with the individual blocking layers being spaced apart from one another. This means that the blocking layers are separated from one another by the insulating material of the printed circuit board. The blocking layers which are arranged in the printed circuit board can have both the dimensions of the blocking layer arranged on the outside of the printed circuit board as well as dimensions which differ therefrom.

Both embodiments also have the advantage that the blocking layer can already be arranged when a printed circuit board is manufactured, and before the printed circuit board is cut to the desired dimensions and/or equipped. The arrangement of the blocking layer can be carried out particularly economically in this way.

Depending on the requirements made of the blocking effect, the blocking layer can be composed of an individual layer or of a plurality of individual layers. In particular in the case of stringent requirements, correspondingly configured layer systems can be used.

A good blocking effect accompanied at the same time by ease of manufacture is achieved with a blocking layer made of copper, nickel, gold, aluminum or of a metal alloy. These materials have the advantage that they can also be used as a material for the conductor tracks. Therefore, methods and devices for applying the conductor tracks can be used for arranging the blocking layer. As a result, the expenditure on a blocking layer can be kept small.

It has been found that the thickness of the blocking layer has an influence on the blocking effect depending on the requirements. A sufficient blocking effect is achieved with blocking layers of thicknesses between 1 µm and 300 µm, preferably between 17.5 µm and 150 µm.

For a sufficiently good blocking effect the blocking layer has substantially the same dimensions as the outer dimensions of the metallic track.

The metallic track for applying the cover can be manufactured particularly easily if it is composed of the material of the conductor tracks, preferably of copper or gold. It is also advantageous that the methods and device for applying the conductor tracks can be used for applying the metallic track.

It contributes to increasing the blocking effect if the width of the enclosed track is greater than the region of the cover which is connected to the printed circuit board via the soldered connection. The width of the metallic track is a measure of the blocking effect since, like the blocking layer, the metallic track acts as a diffusion barrier. To this extent, the diffusion travel in the insulation material of the printed circuit board lengthens with an increasing width of the metallic track, as a result of which the protective effect is increased.

The housing can be fabricated particularly cost-effectively if the blocking layer and the enclosed track are composed of the same material.

An improved blocking effect is achieved with a blocking layer which covers a larger region than the cover on the opposite side of the printed circuit board.

In order to avoid adversely affecting the blocking effect of the blocking layer, a further refinement provides for contact to be made between the circuit and the components thereof by means of electrical lines which are led in from the outside, by means of connecting lines which are embedded in the printed circuit board. For this purpose, contacts are provided which are arranged on the printed circuit board and are connected to the connecting lines which are embedded in the printed circuit board. This avoids the situation in which the blocking layer or the cover for making contact is interrupted, which would result in a reduction in the blocking effect. The connecting lines can be embodied as one or more conductor levels which are insulated from one another and arranged one on top of the other in the printed circuit board.

According to one advantageous embodiment, an adverse effect on the blocking effect as a result of the connecting lines is avoided by virtue of the fact that the contacts are arranged outside the metallic track and/or outside the blocking layer on the printed circuit board, said blocking layer being arranged on the opposite side of the printed circuit board. For this purpose, it is also conceivable to embody the printed circuit board in a partially enlarged form.

The regions of the printed circuit board which are unprotected due to the contact arrangement can be reduced if the contacts are arranged inside the metallic track and/or inside the blocking layer which is arranged on the opposite side of the printed circuit board, wherein the metallic track and/or the blocking layer surround the contacts at a distance which is embodied as an annular gap.

The diffusion of fuel over the outer edge which forms the periphery of the printed circuit board is prevented with a further blocking layer. This further blocking layer is arranged on the periphery of the printed circuit board in such a way that the metallic track and the blocking layer arranged on the opposite side of the printed circuit board are connected to one another.

BRIEF DESCRIPTION OF THE DRAWINGS

FIG. 3 shows a second embodiment of the printed circuit board according to FIG. 1.

FIGS. 4 and 5 show further embodiments of the housing according to FIG. 2.

DETAILED DESCRIPTION OF THE PREFERRED EMBODIMENTS

Figure 1:
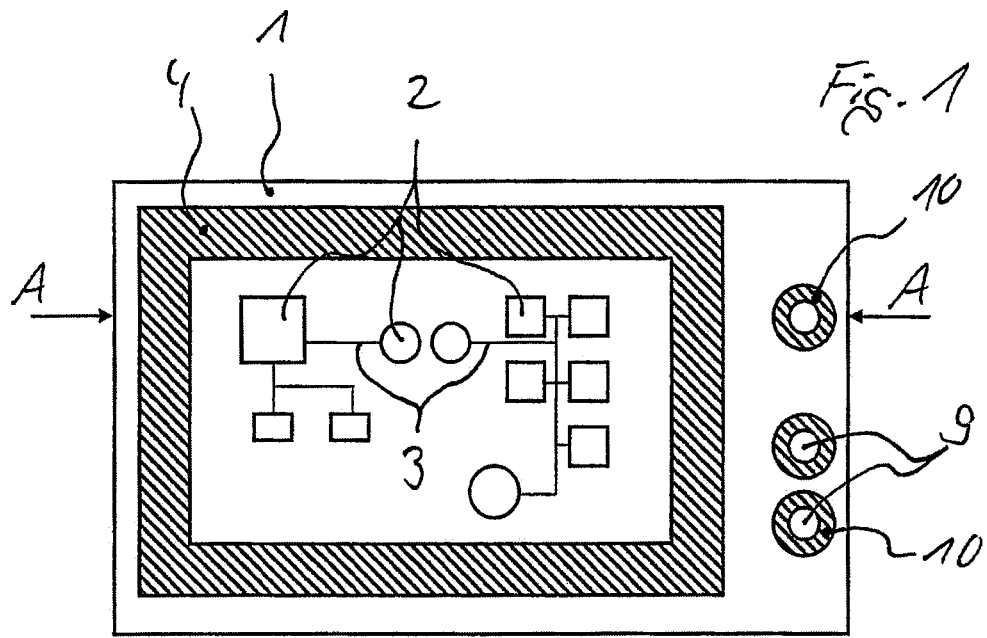
FIG. 1 shows the printed circuit board of a housing according to the present invention.

FIG. 1 shows a printed circuit board 1 in a plan view, wherein for the sake of better illustration no cover is shown. Electronic components 2 of an electronic circuit are arranged on the printed circuit board 1 and are connected to one another via conductor tracks 3. In the edge region of the printed circuit board, an enclosed metallic track 4, which surrounds the electronic circuit, is arranged. The enclosed metallic track 4 is composed of copper, as are the conductor tracks 3. The printed circuit board 1 is composed of a synthetic resin on an epoxide basis. On one side, the printed circuit board 1 has a plurality of breakthroughs 9 outside the enclosed metallic track 4, said breakthroughs 9 being lined with copper. The breakthroughs 9 form contacts 10 for connecting the electronic circuit to corresponding electrical connecting lines, which are not illustrated here.

Figure 2:
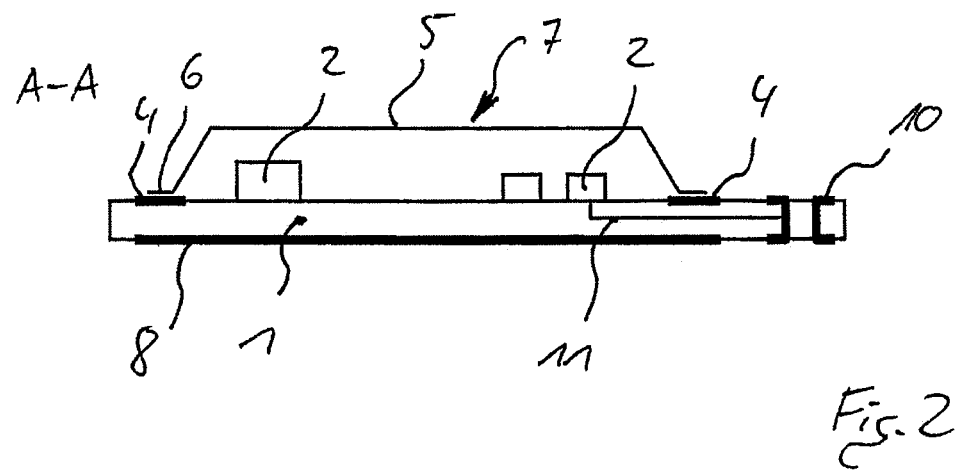
FIG. 2 shows a sectional illustration of the housing according to the invention from FIG. 1.

FIG. 2 shows the printed circuit board 1 in section with the components 2. The components 2 and the enclosed metallic track 4 are arranged on the upper side of the printed circuit board 1. A cover 5 made of metal is soldered on to the metallic track 4 and completely covers the electronic circuit with the components 2. The edge 6 of the cover 5 is directed outwards in the manner of a flange in order to provide a good bearing face for the connection to the printed circuit board 1. The printed circuit board 1 and the cover 5 therefore form the housing 7.

A blocking layer 8 made of copper is arranged over a large area on the underside of the printed circuit board 1 and has, in its external dimensions, approximately the dimensions of the metallic track 4. The cover 5 protects the electronic circuit directly against contact with fuel, while the blocking layer 8 prevents fuel from diffusing through the printed circuit board 1 from below. Only the unprotected circumferential edge of the printed circuit board 1 is now subjected to contact with the fuel or fuel vapors. As a result, fuel now can only pass through the printed circuit board material between the metallic track 4 and the blocking layer 8 and into the space covered by the cover 5. The width of the metallic track 4 therefore determines the length of the printed circuit board material through which the fuel must diffuse until the components 2 are reached. Therefore, the blocking effect can be improved even further by widening the metallic track 4.

A conductor level 11, which connects the components 2 of the electronic circuit to the respective contacts 10, and which acts as a connecting line, is arranged in the printed circuit board 1.

The printed circuit board 1 which is illustrated in FIGS. 3 and 4, is defined by a modified metallic track 4 and blocking layer 8. On the side of the printed circuit board 1 on which the contacts 10 are arranged, the width of the metallic track 4 and that of the blocking layer 8 are widened to such an extent that they completely enclose the contacts 10. Only a narrow annular gap 12 around each contact 10 ensures the electrical isolation of the contact 10 and the metallic track 4 or blocking layer 8. This embodiment provides even better protection. Furthermore, the printed circuit board 1 has a further blocking layer 8a which is arranged inside the printed circuit board 1. The second blocking layer 8a generates an additional blocking effect, inter alia by virtue of the fact that the distance between the blocking layer and the cover 5 is shortened. The blocking layer 8b has slightly different dimensions than the blocking layer 8 which is arranged on the outside of the printed circuit board 1. In particular, in the region of the contacts 10, the blocking layer is arranged closer to the contacts 10 than the blocking layer 8 is owing to the necessary annular gap 12. As a result of this overlapping of the individual blocking layers 8, 8a, an additional protection is achieved in the region of the contacts 10.

In the printed circuit board 1 in FIG. 5, the previously exposed circumferential edge is provided with a further blocking layer 8b in the form of a copper layer, wherein the blocking layer 8b connects the blocking layer 8 to the metallic track 4, with the result that the surface of the printed circuit board 1 is exposed only in the region of the annular gaps 12.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A housing for an electronic circuit for a fuel pump, comprising:
    a printed circuit board configured as a base of the housing;
    at least one of electric components and electronic components arranged on a first planar side of the printed circuit board;
    a cover connected to the base;
    a blocking layer arranged on and contacting a second planar side of the printed circuit board opposite the electric components and electronic components arranged on the first planar side and configured to prevent fuel from diffusing through the printed circuit board; and
    an enclosed metallic track arranged on the first planar side of the printed circuit board on which the components are arranged, an entirety of the enclosed metallic track contacting the first planar side of the printed circuit board, wherein:
        the components are arranged in a region enclosed by the metallic track, and
        the cover is connected to the metallic track by a soldered connection.

2. The housing as claimed in claim 1, wherein the blocking layer is arranged as at least one layer in the printed circuit board.

3. The housing as claimed in claim 1, wherein the blocking layer includes a plurality of individual layers.

4. The housing as claimed in claim 1, wherein the blocking layer includes one of copper, nickel, gold, aluminum, and a metal alloy.

5. The housing as claimed in claim 1, wherein a thickness of the blocking layer is between 1 µm and 300 µm.

6. The housing as claimed in claim 1, wherein a thickness of the blocking layer is between 17.5 µm and 150 µm.

7. The housing as claimed in claim 1, wherein the metallic track includes a material of a conductor track.

8. The housing as claimed in claim 7, wherein the material of the conductor track includes one of copper and gold.

9. The housing as claimed in claim 1, wherein a width of the metallic track is greater than that of a region of the cover connected to the printed circuit board via the soldered connection.

10. The housing as claimed in claim 1, wherein the blocking layer and the metallic track are composed of the same material.

11. The housing as claimed claim 1, wherein the blocking layer covers a larger region than the cover on the second planar side of the printed circuit board.

12. The housing as claimed in claim 1, wherein the printed circuit board includes contacts that are connected in an electrically conductive fashion to at least one of the components in each case, and wherein the connection of the components to the contacts is made by connecting lines embedded in the printed circuit board.

13. The housing as claimed in claim 12, wherein the contacts are arranged outside at least one of the metallic track and the blocking layer on the printed circuit board.

14. The housing as claimed in claim 12, wherein the contacts are arranged inside at least one of the metallic track and the blocking layer, wherein at least one of the metallic track and the blocking layer surrounds the contacts at a distance embodied as an annular gap.

15. The housing as claimed in claim 1, wherein the blocking layer corresponds to a first blocking layer, the housing further comprising:
    a further blocking layer arranged on a periphery of the printed circuit board such that the further blocking layer connects the metallic track and the first blocking layer to one another.

16. The housing as claimed in claim 1, wherein the blocking layer is arranged over an area and has, in its external dimensions, approximately the dimensions of the metallic track.

* * * * *